(12) United States Patent
Nakajima (10) Patent No.: US 8,138,553 B2
(45) Date of Patent: Mar. 20, 2012

(54) SEMICONDUCTOR DEVICE AND METHOD OF MANUFACTURING THE SAME

(75) Inventor: Kazuaki Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 12/686,141

(22) Filed: Jan. 12, 2010

(65) Prior Publication Data

US 2010/0176458 A1      Jul. 15, 2010

(30) Foreign Application Priority Data

Jan. 14, 2009    (JP) ................... 2009-005846

(51) Int. Cl.
*H01L 276/06*    (2006.01)
*H01L 21/28*    (2006.01)

(52) U.S. Cl. .................. 257/379; 257/390; 257/E21.19; 257/E21.004; 438/382; 438/239

(58) Field of Classification Search .................. 257/379, 257/E21.19, E21.004, E27.016, 390; 438/382, 438/239
See application file for complete search history.

(56) References Cited

U.S. PATENT DOCUMENTS

2007/0090417 A1*  4/2007  Kudo ............................ 257/288
2007/0128790 A1*  6/2007  Dainin ........................... 438/238

FOREIGN PATENT DOCUMENTS

JP    2005-150178    6/2005

* cited by examiner

*Primary Examiner* — Cuong Q Nguyen
*Assistant Examiner* — Cathy N Lam
(74) *Attorney, Agent, or Firm* — Finnegan, Henderson, Farabow, Garrett & Dunner, L.L.P.

(57) ABSTRACT

A gate insulating film is formed on a main surface of a substrate in which an element isolation region is formed. A metal film is formed on the gate insulating film. A silicon film is formed on the metal film. A gate electrode of a MIS transistor composed of a stacked structure of the silicon film and metal film is formed on an element region and a high-resistance element composed of a stacked structure of the silicon film and metal film is formed on the element isolation region by patterning the silicon film and metal film. An acid-resistant insulating film is formed on the side of the gate electrode. The metal film of the high-resistance element is oxidized. A diffused layer of the MIS transistor is formed in the substrate.

4 Claims, 7 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2009-005846, filed Jan. 14, 2009, the entire contents of which are incorporated herein by reference.

BACKGROUND OF THE INVENTION

1. Field of the Invention

This invention relates to a semiconductor device where MIS transistors each including a gate electrode with a stacked structure of a silicon film and a metal film and high-resistance elements are integrated and to a method of manufacturing the semiconductor device.

2. Description of the Related Art

Polysilicon (Poly-Si) has been widely used as a material for high-resistance elements in logic devices. A resistance element composed of a polysilicon film can be formed by the polysilicon film in the same layer as the gate electrode of a MIS transistor. Controlling the impurity concentration of a polysilicon film enables its resistance to be set freely and a high resistance not lower than 800Ω/□ to be realized easily.

In recent years, however, to increase the operation speed by reducing the gate delay, metal material has been used for the gate electrode of a MIS transistor (e.g., refer to Jpn. Pat. Appln. KOKAI Publication No. 2005-150178). Since the resistance of such a metal gate electrode is low, it is difficult to form a high-resistance element using the same layer as that of the gate electrode. Even when the gate electrode has a stacked structure of metal and polysilicon (MIPS: Metal Inserted Poly-Si Stack) where the metal layer is composed of a thin film (not more than 10 nm), a resistance element with a sufficiently high resistance cannot be realized using the same layer as that of the gate electrode.

Accordingly, a MIS transistor and a high-resistance element have to be formed in separate processes. Alternatively, after an MIPS-structure resistance element is formed, the metal layer of the resistance element has to be removed to increase the resistance of the element. The process of removing the metal layer is very complicated and an increase in the number of manufacturing processes might lead to a decrease in the yield.

BRIEF SUMMARY OF THE INVENTION

According to a first aspect of the invention, there is provided a method of forming a semiconductor device comprising: forming a gate insulating film on a main surface of a substrate in which an element isolation region is formed; forming a metal film on the gate insulating film; forming a silicon film on the metal film; forming a gate electrode of a MIS transistor composed of a stacked structure of the silicon film and metal film on an element region and a high-resistance element composed of a stacked structure of the silicon film and metal film on the element isolation region by patterning the silicon film and metal film; forming an acid-resistant insulating film on the side of the gate electrode; oxidizing the metal film of the high-resistance element; and forming a diffused layer of the MIS transistor in the substrate.

According to a second aspect of the invention, there is provided a semiconductor device comprising: a MIS transistor which includes a gate electrode composed of a stacked structure of a metal film and a first silicon film formed on the metal film; and a high-resistance element composed of a stacked structure of an oxide film of the metal film and a second silicon film formed on the oxide film.

DETAILED DESCRIPTION OF THE INVENTION

First, the techniques in relation to the invention will be explained with reference to FIGS. 11 to 16. FIGS. 11 to 16 are sectional views to sequentially explain the steps of forming a MIS transistor including metal gate electrode and a high-resistance element.

Figure 11:
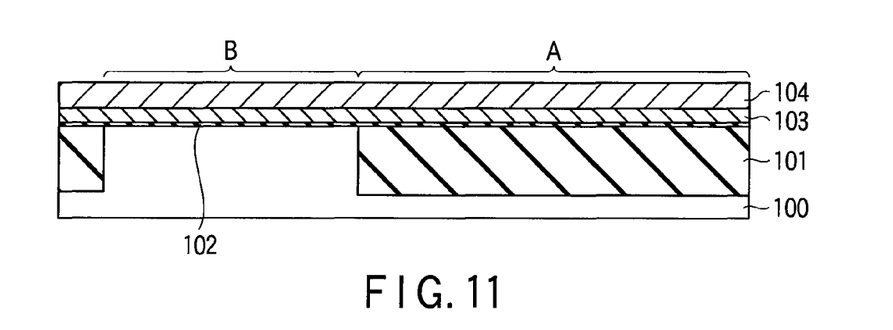
FIGS. 11 to 16 are sectional views showing formation steps in a method of manufacturing a semiconductor device in relation to the invention.

First, as shown in FIG. 11, in the main surface of a semiconductor substrate, for example, a monocrystalline silicon substrate 100, an STI-structure element isolation region 101 is formed. In this example, a region where an element isolation region 101 has been formed is a passive element region A where a high-resistance element is to be formed. An element region where an element isolation region 101 is not formed is a transistor region B. Next, on the monocrystalline silicon substrate 100, a hafnium-containing gate insulating film 102 of thickness approximately 2 nm is formed by, for example, chemical vapor deposition (CVD) using an organic source. On the gate insulating film 102, a TiN film 103 is formed as a metal electrode so as to have a thickness of 5 nm by, for example, sputtering. On the TiN film 103, an amorphous silicon film 104 is formed to so as to have a thickness of 10 nm.

Figure 12:
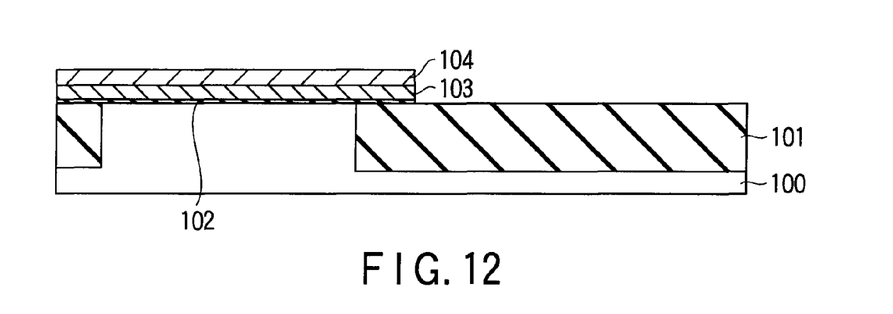

Next, as shown in FIG. 12, the amorphous silicon film 104, TiN film 103, and gate insulting film 102 in the passive element region A are removed.

Figure 13:
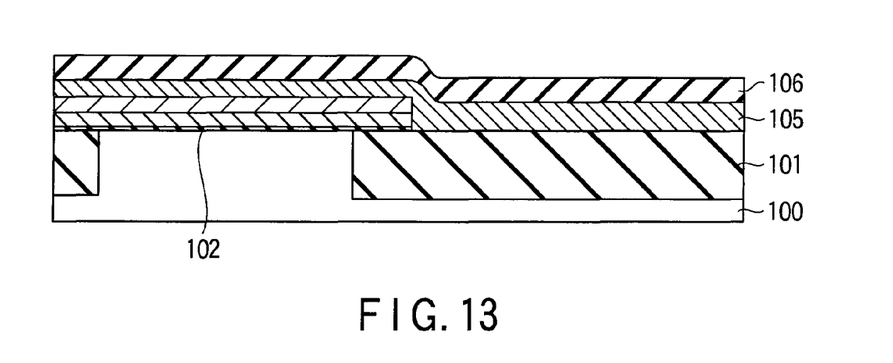

Next, as shown in FIG. 13, on the amorphous silicon film 104 and exposed element isolation region 101, an amorphous silicon film 105 is formed so as to have a thickness of, for example, 60 nm. On the amorphous silicon film 105, a silicon nitride film 106 is formed so as to have a thickness of, for example, 70 nm.

Thereafter, the silicon nitride film 106 is patterned. With the patterned silicon nitride film 106 as a mask, the amorphous silicon films 105, 104 and TiN film 103 are anisotropically etched so as to produce, for example, a 30-nm gate width pattern, thereby forming a gate electrode. At this time, the amorphous silicon film 105 on the element isolation region 101 is anisotropically etched, forming a high-resistance element. Moreover, by anisotropic etching or a process using diluted HF, the hafnium-containing gate insulating film 102 on the substrate 100 around the gate electrode is removed in the transistor region B.

Figure 14:
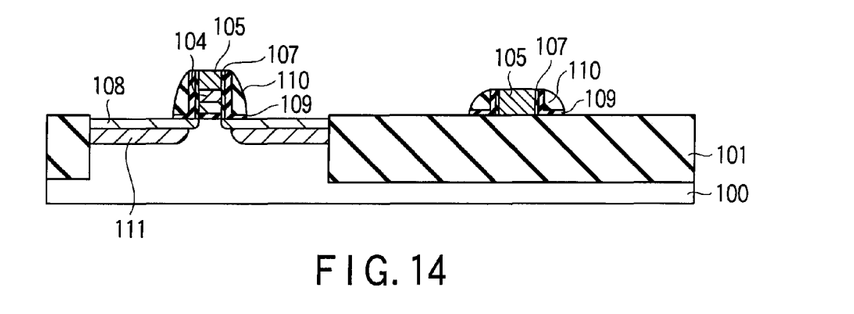

Next, after a silicon nitride film 107 has been formed on the entire surface, the silicon nitride film 107 is etched back, leaving the silicon nitride film 107 only on the sidewall portion of the gate electrode pattern and high-resistance element as shown in FIG. 14. In addition, with the gate electrode pattern as a mask, impurity ions are implanted into the main surface of the substrate 100. Thereafter, by a heating treatment, a shallow diffused layer 108 is formed as an extension region of the MIS transistor.

Next, after a silicon oxide film 109 and a silicon nitride film 110 have been formed on the entire surface, the silicon oxide film 109 and silicon nitride film 110 are etched back, forming a spacer structure where the silicon oxide film 109 and silicon nitride film 110 are left only on the sidewall portion of the gate electrode pattern and high-resistance element. In addition, with the gate electrode pattern as a mask, impurity ions are implanted into the main surface of the substrate 100. Thereafter, by a heating treatment, a deep diffused layer 111 is formed as a source-drain region of the MIS transistor.

Figure 15:
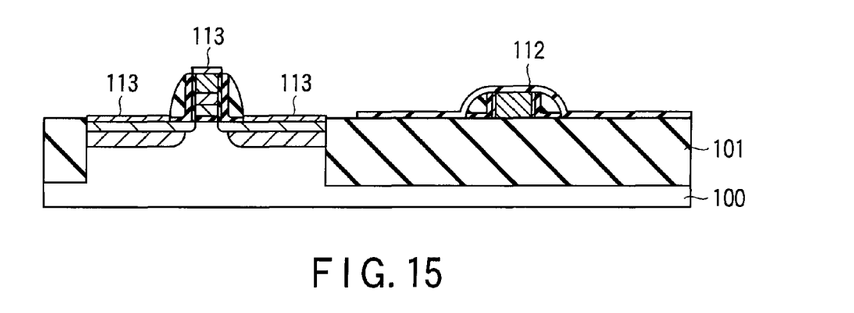

Next, as shown in FIG. 15, after a silicon nitride film 112 has been formed on the entire surface, the silicon nitride film 112 in the transistor region B is removed by, for example, dry etching. Next, for example, an Ni film (10 nm in thickness) is formed on the entire surface. The Ni film is heated at a temperature of 350° C. for approximately 30 seconds, causing Ni and silicon to react with each other. Thereafter, the unreacted Ni film is removed by, for example, a mixed solution of sulfuric acid and hydrogen peroxide solution. Thereafter, heating is performed at a temperature of 500° C. for approximately 30 seconds. As a result, a silicide layer 113 is formed on the gate electrode and on the diffused layer 108.

At this time, the high-resistance element portion is covered with the silicon nitride film 112 and therefore a silicide film is not formed. The reason why such silicidation is selectively performed is that the resistivity of silicide is as low as approximately 18 μΩ·cm and therefore forming silicide on the high-resistance element would make the resistance of the high-resistance element portion too low. Impurity ions are introduced into the high-resistance element portion as needed, setting the resistance in terms of impurity concentration.

Figure 16:
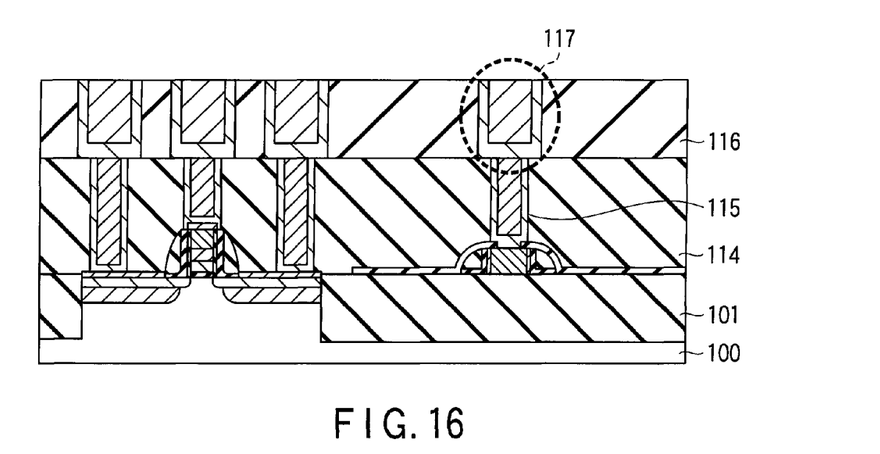

Thereafter, as shown in FIG. 16, a first interlayer film 114 is formed on the entire surface. At the first interlayer film 114, a desired contact pattern is formed. In the contact pattern, for example, a Ti/TiN/W film is buried and planarized by CMP, thereby forming a contact 115. Next, on the first interlayer film 114, a second interlayer film 116 is formed. In the second interlayer film 116, a desired groove pattern is formed. In the groove pattern, a TaN/Cu film is buried and planarized by CMP, thereby forming a Cu interconnect 117 electrically connected to the contact 115.

By the aforementioned manufacturing processes, a metal gate transistor which has a gate electrode with a stacked structure of the TiN film 103 and amorphous silicon films 104, 105 is formed in the transistor region B and a high-resistance element composed of the amorphous silicon film 105 is formed in the passive element region A.

Here, the reason why the TiN film 103 in the passive element region A has been removed in the process of FIG. 12 will be described.

In a polysilicon gate transistor, the gate electrode is a single-layer polysilicon film and therefore the high-resistance element is composed of the same single-layer polysilicon film as the gate electrode. By controlling the impurity concentration of the polysilicon film in the high-resistance element, a desired resistance is obtained at the high-resistance element portion.

On the other hand, in a metal gate transistor, the gate electrode has a stacked structure of metal and a silicon film and therefore forming a high-resistance element with the same structure makes the resistance of the high-resistance element portion very low. This is because the resistance of the high-resistance element portion is mostly determined by the metal portion, not by the impurity concentration of the silicon film. Therefore, to realize high resistance, the metal film has to be removed as shown in FIG. 12. The process of removing the metal film is complicated and the yield might be decreased due to an increase in the number of processes.

Therefore, in a semiconductor device and a method of manufacturing the semiconductor device according to embodiments of the invention, a gate electrode with a stacked structure of a silicon film and a metal film and a high-resistance element with a stacked structure of a silicon film and a metal film are formed in the same process and the metal film of the high-resistance element is oxidized from the side, thereby forming an insulating film or achieving higher resistance.

Hereinafter, referring to the accompanying drawings, embodiments of the invention will be explained.

First Embodiment

Figure 1:
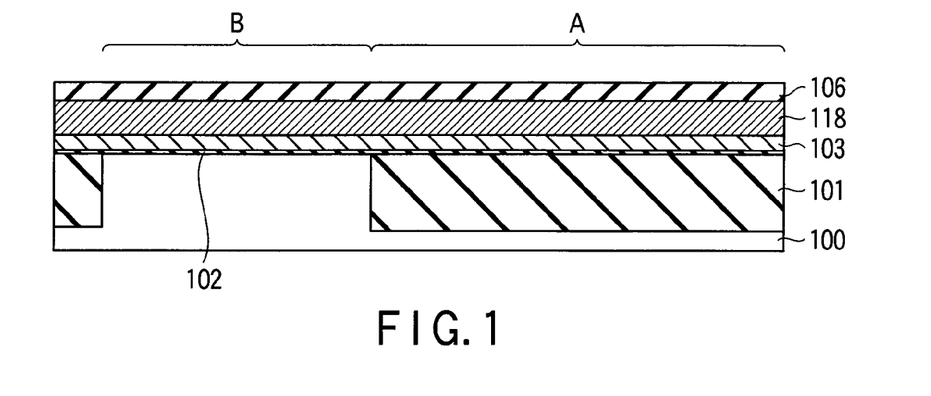
FIGS. 1 to 5 are sectional views of a semiconductor device according to a first embodiment of the invention, showing formation steps in a method of manufacturing the semiconductor device.

First, as shown in FIG. 1, in the main surface of a semiconductor substrate, for example, a monocrystalline silicon substrate 100, an STI-structure element isolation region 101 is formed. A region where an element isolation region 101 is not formed is a transistor region B. A region where an element isolation region 101 has been formed is a passive element region A. On the monocrystalline silicon substrate 100, a hafnium-containing gate insulating film 102 of thickness approximately 2 nm is formed by, for example, chemical vapor deposition (CVD) using an organic source. On the gate insulating film 102, a TiN film 103 of thickness 5 nm is formed as a metal electrode by, for example, sputtering. On the TiN film 103, an amorphous silicon film 118 of thickness 70 nm is formed. On the amorphous silicon film 118, a silicon nitride film 106 of thickness 70 nm is formed.

Figure 2:
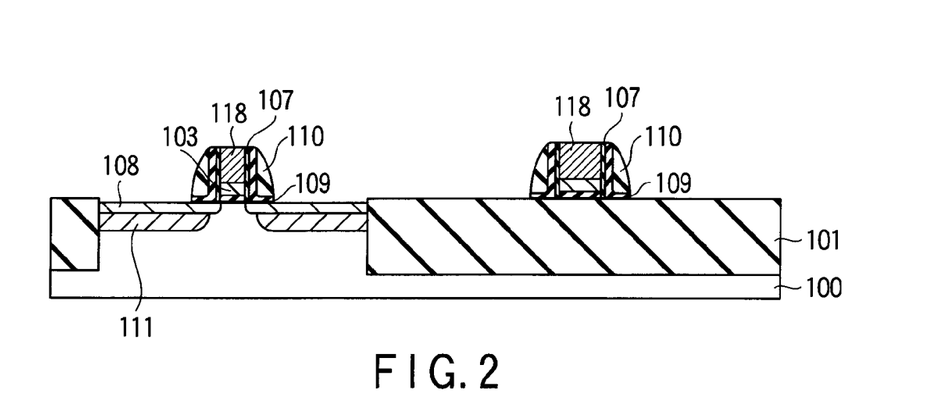

Next, as shown in FIG. 2, the silicon nitride film 106 is patterned. With the patterned silicon nitride film 106 as a mask, the amorphous silicon film 118 and TiN film 103 are anisotropically etched. The amorphous silicon film 118 and TiN film 103 are etched so as to produce, for example, a 30-nm gate width pattern and a high-resistance element pattern. Thus a gate electrode and a high-resistance element are formed. Moreover, by anisotropic etching or a diluted Hf process, the hafnium-containing gate insulating film 102 on the substrate 100 is removed.

Next, a silicon nitride film 107 is formed on the entire surface. Thereafter, the silicon nitride film 107 is etched back, leaving the silicon nitride film 107 only on the sidewall portion of the gate electrode pattern and high-resistance element. In addition, with the gate electrode pattern as a mask, impurity ions are implanted into the main surface of the substrate 100, followed by a heating treatment. As a result, a shallow diffused layer (a first diffused layer) 108 is formed as an extension region of the MIS transistor.

Next, a silicon oxide film 109 and a silicon nitride film 110 are formed on the entire surface. Thereafter, the silicon oxide film 109 and silicon nitride film 110 are etched back so as to leave the silicon oxide film 109 and silicon nitride film 110 only on the sidewall portion of the gate electrode pattern and high-resistance element, thereby forming a spacer structure. In addition, with the gate electrode pattern as a mask, impurity ions are implanted into the main surface of the substrate 100, followed by a heating treatment. As a result, a deep diffused layer (a second diffused layer) 111 is formed as a source-drain region of the MIS transistor. The impurity concentration of the diffused layer 111 is made higher than that of the diffused layer 108.

Figure 3:
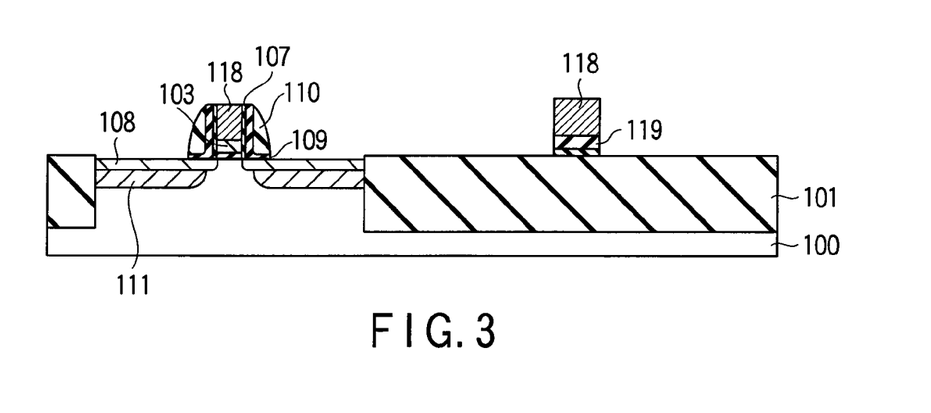

Next, as shown in FIG. 3, the silicon nitride film 110, silicon oxide film 109, and silicon nitride film 107 in the passive element region A are removed, exposing the side of the TiN film 103 in the passive element region A. Thereafter, the TiN film 103 is oxidized at a temperature of, for example, 400° C. for one hour, thereby forming a TiON film 119. It is known that a metal film including a TiN film is sufficiently oxidized even at low temperature and its resistance increases.

Figure 4:
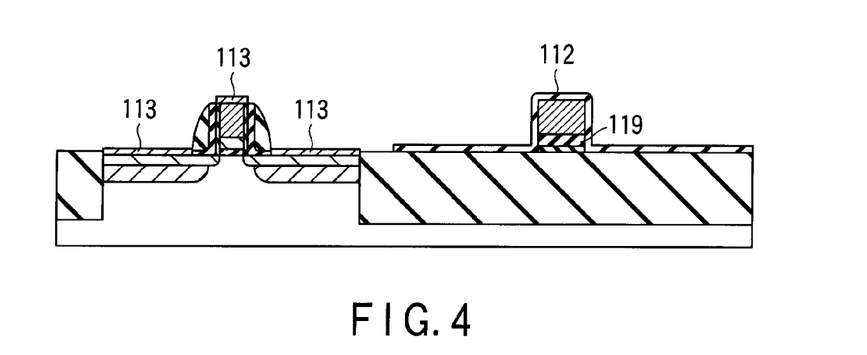

Next, as shown in FIG. 4, a silicon nitride film 112 is formed on the entire surface. Thereafter, the silicon nitride film 112 in the transistor region B is removed by, for example, dry etching. Next, for example, an Ni film (10 nm in thickness) is formed on the entire surface. The Ni film is heated at a temperature of 350° C. for approximately 30 seconds, causing Ni and silicon to react with each other. Thereafter, the unreacted Ni film is removed by, for example, a mixed solution of sulfuric acid and hydrogen peroxide solution. Thereafter, heating is performed at a temperature of 500° C. for approximately 30 seconds. As a result, a silicide layer 113 is formed on the gate electrode (amorphous silicon film 118) and on the diffused layer 108.

At this time, the high-resistance element portion is covered with the silicon nitride film 112 and therefore a silicide film is not formed. The reason why such silicidation is selectively performed is that the resistivity of silicide is as low as approximately 18 $\mu\Omega\cdot cm$ and therefore forming silicide on the high-resistance element would make the resistance of the high-resistance element portion too low. Thereafter, impurity ions are introduced into the high-resistance element portion as needed, setting the resistance in terms of impurity concentration. That is, the amorphous silicon film (second silicon film) 118 at the high-resistance element portion is higher in impurity concentration than the amorphous silicon film (first silicon film) 118 at the gate electrode.

Figure 5:
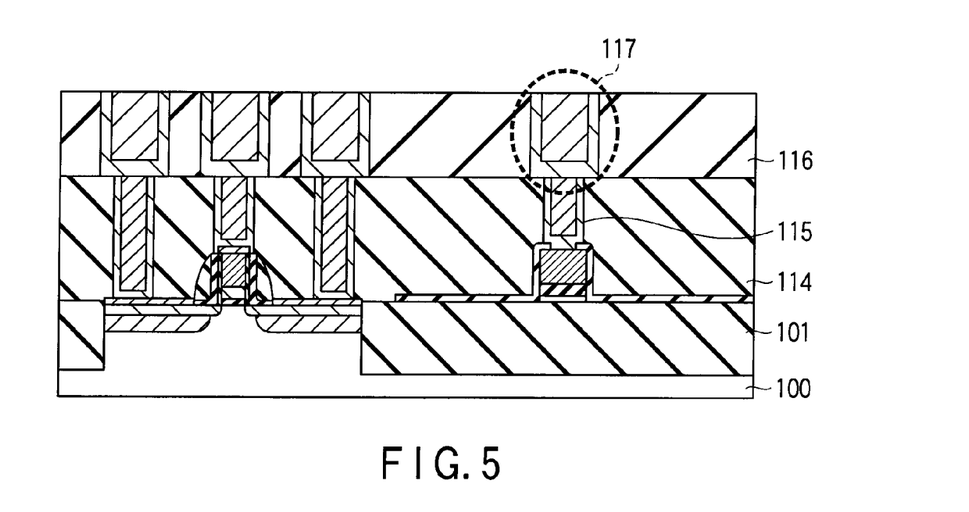

Thereafter, as shown in FIG. 5, a first interlayer film 114 is formed on the entire surface. At the first interlayer film 114, a desired contact pattern is formed. In the contact pattern, for example, a Ti/TiN/W film is buried and planarized by CMP, thereby forming a contact 115. Next, on the first interlayer film 114, a second interlayer film 116 is formed. In the second interlayer film 116, a desired groove pattern is formed. In the groove pattern, a TaN/Cu film is buried and planarized by CMP, thereby forming a Cu interconnect 117 electrically connected to the contact 115.

By the aforementioned manufacturing processes, a metal gate transistor which has a gate electrode with a stacked structure of the TiN film 103 and amorphous silicon film 118 is formed in the transistor region B and a high-resistance element with a stacked structure of the TiON film 119 and amorphous silicon film 118 is formed in the passive element region A. Here, since the TiON film 119 is an insulating film, the resistance of the high-resistance element is practically determined by the resistance of the amorphous silicon film 118. The resistance of the amorphous silicon film 118 is set by its impurity concentration.

Figure 6:
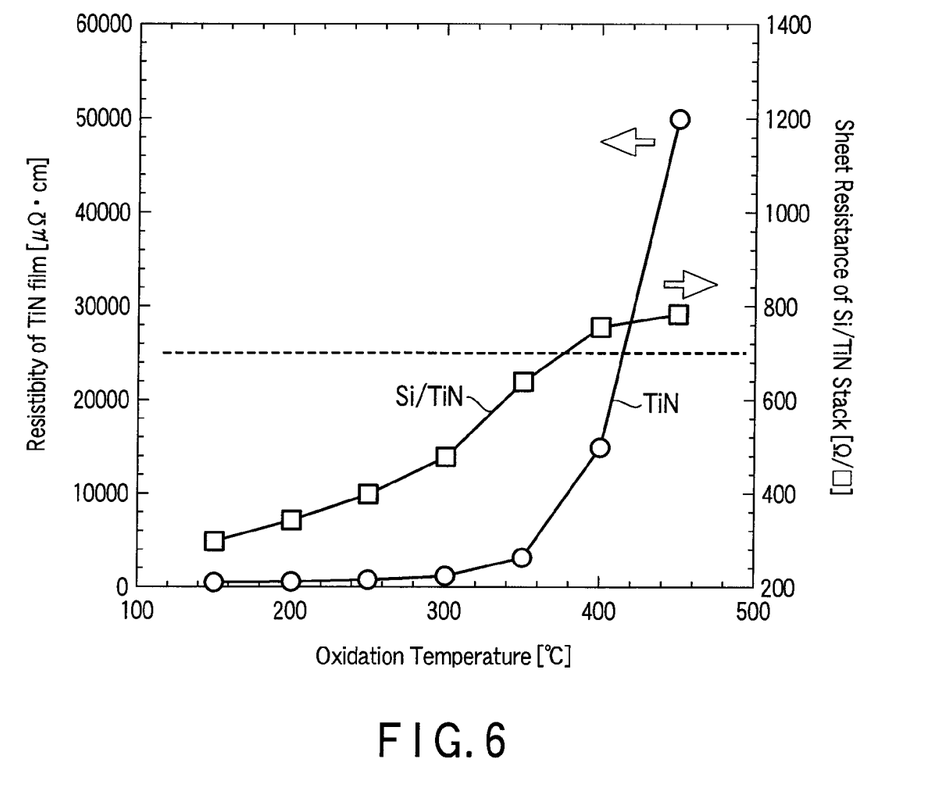
FIG. 6 is a diagram showing the relationship between the resistivity of a TiN film and the dependence of the TiN film on oxidation temperature and the relationship between the sheet resistance of a stacked film of a silicon film and a TiN film and the dependence of the stacked film on oxidation temperature.

FIG. 6 shows the relationship between the resistivity of a TiN film and the oxidation temperature and the relationship between the sheet resistance of a stacked film of a silicon film and the oxidation temperature. When oxidizing is not performed, the resistivity of the TiN film is approximately 200 $\mu\Omega\cdot cm$. The sheet resistance of the stacked film is equal to that of a parallel connection of the resistance of the TiN film and that of silicon film. Accordingly, when the resistivity of the TiN is low, the sheet resistance of the stacked film is mostly determined by the resistance of the TiN film, even if the resistance of the silicon film is high.

However, when oxidation temperature is raised to approximately 300° C., the resistivity of the TiN film exceeds $1\times10^3$ $\mu\Omega\cdot cm$. Therefore, the sheet resistance of the stacked film increases to approximately half the resistance of the single-layer silicon film. When oxidation temperature is further raised to 400° C., the resistivity of the TiN film increases to approximately $1\times10^4$ $\mu\Omega\cdot cm$, with the result that the resistance of the TiN film becomes negligible in comparison with that of the silicon film. If the sheet resistance of the stacked film has reached at least approximately the resistance of the single-layer silicon film, such as 700$\Omega$/□, the stacked film functions as a high-resistance element.

Second Embodiment

Figure 7A:
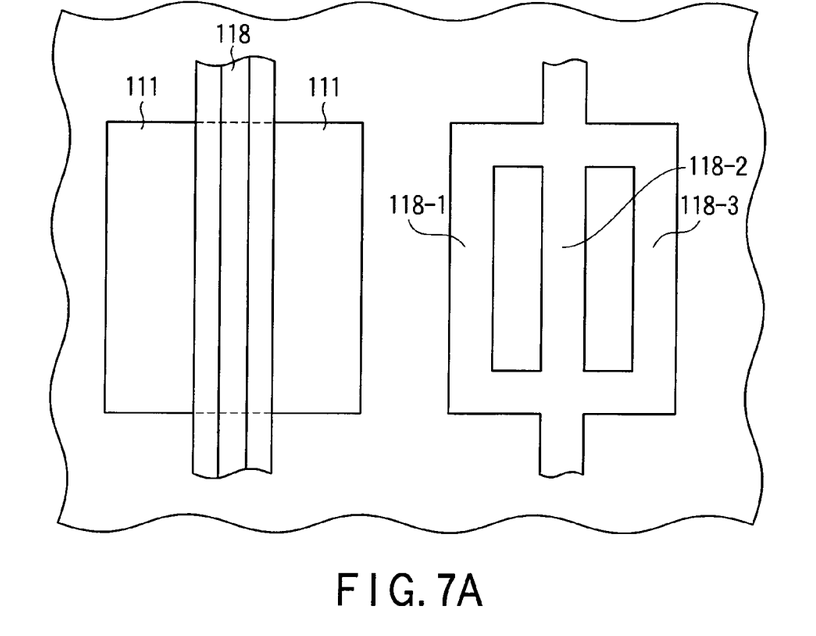
FIG. 7A is a pattern plan view of a semiconductor device according to a second embodiment of the invention, showing a formation step in a method of manufacturing the semiconductor device.
Figure 7B:
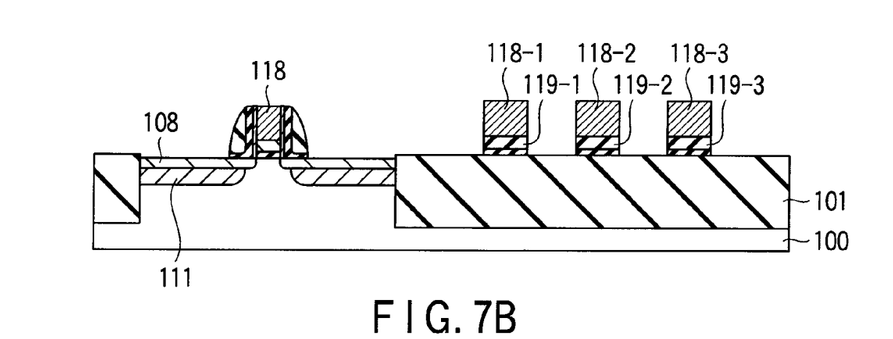
FIG. 7B is a sectional view of the semiconductor device of the second embodiment, showing a formation step in the method of manufacturing the semiconductor device.

FIGS. 7A and 7B are diagrams to explain a semiconductor device and a method of manufacturing the semiconductor device according to a second embodiment of the invention. FIGS. 7A and 7B correspond to a plan view and a sectional view corresponding to the step shown in FIG. 3, respectively. In the step of FIG. 3, when a TiN film 103 is oxidized to form a TiON film 119, a greater pattern width of a high-resistance element requires a longer heat treatment time to cause oxidation to progress from the sidewall.

Therefore, in the second embodiment, to accelerate the progress of oxidation, the pattern of a high-resistance element is divided. That is, in the second embodiment, a plurality of narrow resistance element patterns (three in the second embodiment) are connected in parallel. The remaining basic configuration and manufacturing method are the same as in the first embodiment and therefore a detailed explanation will be omitted.

Even the configuration and manufacturing method according to the second embodiment provide the same operational advantages as in the first embodiment. Furthermore, the time required for heat treatment in oxidizing the TiN film 103 to form TiON films 119-1, 119-2, 119-3 can be shortened.

Third Embodiment

Figure 8:
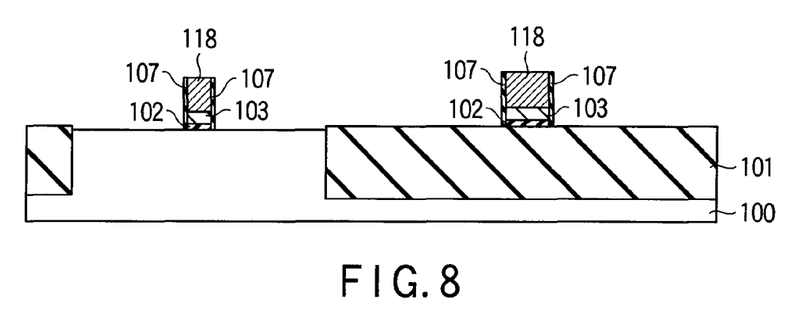
FIGS. 8 to 10 are sectional views of a semiconductor device according to a third embodiment of the invention, showing formation steps in a method of manufacturing the semiconductor device.
Figure 9:
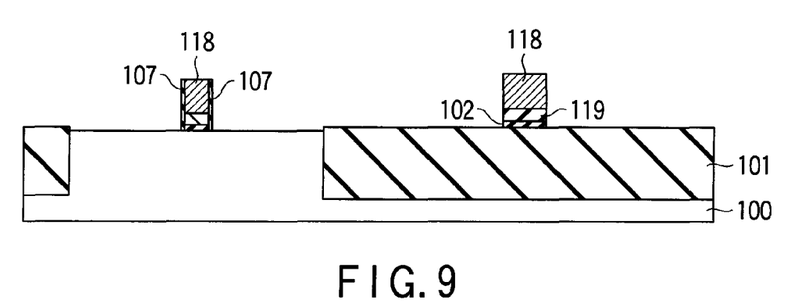
Figure 10:
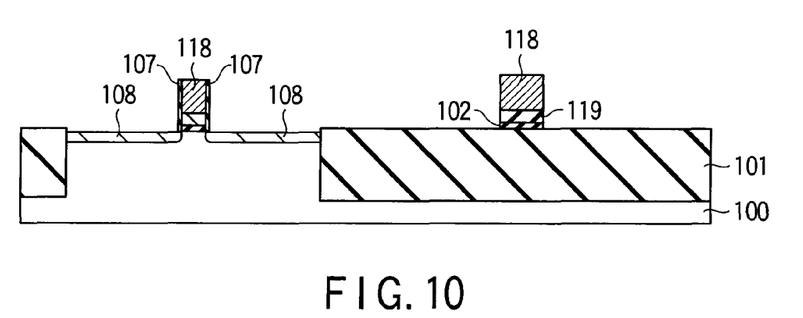

FIGS. 8 to 10 are diagrams to explain a semiconductor device and a method of manufacturing the semiconductor device according to a third embodiment of the invention. Specifically, FIGS. 8 to 10 are sectional views sequentially showing the steps of manufacturing the configurations shown in FIGS. 1 and 2. In the third embodiment, before the formation of the diffused layer 111 for a source-drain region of the MIS transistor, the sidewall is oxidized to turn the TiN film 103 into an insulating film (a TiON film).

Specifically, as shown in FIG. 1, on the monocrystalline silicon substrate 100, a hafnium-containing gate insulating film 102 of thickness approximately 2 nm is formed by, for example, chemical vapor deposition (CVD) using an organic source. On the gate insulating film 102, a TiN film 103 of thickness 5 nm is formed as a metal electrode by, for example, sputtering. On the TiN film 103, an amorphous silicon film 118 of thickness 70 nm is formed. On the amorphous silicon film 118, a silicon nitride film 106 of thickness 70 nm is formed.

Next, the silicon nitride film 106 is patterned. With the patterned silicon nitride film 106 as a mask, the amorphous silicon film 118 and TiN film 103 are anisotropically etched. The amorphous silicon film 118 and TiN film 103 are etched so as to produce, for example, a 30-nm gate width pattern and a high-resistance element pattern, thereby forming a gate electrode and a high-resistance element. Moreover, by, for example, anisotropic etching or a diluted Hf process, the hafnium-containing gate insulating film 102 on the substrate 100 is removed.

Next, a silicon nitride film 107 is formed on the entire surface. Thereafter, as shown in FIG. 8, the silicon nitride film 107 is etched back, leaving the silicon nitride film 107 only on the sidewall portion of the electrode pattern and high-resistance element.

Next, as shown in FIG. 9, the silicon nitride film 107 in the passive element region A is removed, exposing the side of the TiN film 103 in the passive element region A. Thereafter, the TiN film 103 is oxidized at a temperature of, for example, 400° C. for one hour, thereby forming a TiON film 119.

Next, with the gate electrode pattern as a mask, impurity ions are implanted into the main surface of the substrate 100, followed by a heating treatment. As a result, a shallow diffused layer 108 is formed as an extension region of the MIS transistor as shown in FIG. 10.

Next, a silicon oxide film 109 and a silicon nitride film 110 are formed on the entire surface. Thereafter, the silicon oxide film 109 and silicon nitride film 110 are etched back so as to leave the silicon oxide film 109 and silicon nitride film 110 only on the sidewall portion of the electrode pattern and high-resistance element, thereby forming a spacer structure. In addition, with the gate electrode pattern as a mask, impurity ions are implanted into the main surface of the substrate 100, followed by a heating treatment. As a result, a deep diffused layer 111 is formed as a source-drain region of the MIS transistor.

Since the remaining part of the manufacturing method is the same as the steps shown in FIGS. 3 to 5 in the first embodiment, a detailed explanation will be omitted.

Even the configuration and manufacturing method according to the third embodiment provide the same operational advantages as in the first embodiment.

As described above, in each of the first to third embodiments, only the stacked-structure high-resistance element formed in the passive element region A by the same process as the metal gate electrode is exposed in an oxygen atmosphere to oxidize the metal film, thereby causing the high-resistance element to be turned into an insulating film or have a high resistance without removing the metal film. Consequently, a high-resistance element can be realized without the step of removing the metal film and therefore a complicated manufacturing process is unnecessary. Accordingly, it is possible to remarkably reduce the number of steps necessary for forming a high-resistance element.

While in the first to third embodiments, thermal oxidation has been used in causing the metal film to be turned into an insulating film or have a high resistance, plasma oxidation may be used. Use of plasma oxidation enables the metal film to be oxidized at a relatively low temperature (e.g., approximately 200° C.) and therefore the effect on (or thermal damage to) the remaining part can be reduced. For example, heat treatment is performed at approximately 500° C. in forming a diffused layer and at approximately 400° C. in forming a silicide layer. Plasma oxidation has almost no effect on those thermal steps. Therefore, the step of causing the metal film to be turned into an insulating film or have a high resistance can be carried out even before or after the step of forming an extension region, a source-drain diffused layer, or a silicide layer.

Although the TiN film has been used as a metal electrode, use of the IVa group (Ti, Zr, Hf) and Va group (V, Nb, Ta) produces the same effect. Similarly, nitride or carbide of the IVa group and Va group, an alloy of the IVa group and Va group and Al or Si, or nitride or carbide of an alloy of the IVa group and Va group and Al or Si may be used.

Furthermore, while a hafnium-containing oxide film has been used as a material for the gate insulating film 102, a material other than the hafnium-containing oxide film may be used. For instance, oxide of Zr, Ti, Ta, Al, Sr, Y, La, or the like, or oxide of any one of those elements and silicon, such as ZrSixOy, or a stacked film of those oxides may be used. Although an amorphous silicon film has been used as a part of the gate electrode, another silicon film, such as a polysilicon film, may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a MIS transistor which includes a gate electrode composed of a stacked structure of a metal film and a first silicon film formed on the metal film; and
    a high-resistance element composed of a stacked structure of an oxide film of the metal film and a second silicon film formed on the oxide film.

2. The semiconductor device according to claim 1, wherein the second silicon film is higher in impurity concentration than the first silicon film.

3. The semiconductor device according to claim 1, wherein materials for the metal film are one of Ti, Zr, Hf, V, Nb and Ta or nitride or carbide of these.

4. The semiconductor device according to claim 1, wherein materials for the metal film are alloys of one of Ti, Zr, Hf, V, Nb and Ta and Al or Si or nitride or carbide of these alloys.

* * * * *